United States Patent
Van Broekhoven et al.

(10) Patent No.: US 6,368,886 B1
(45) Date of Patent: Apr. 9, 2002

(54) METHOD OF RECOVERING ENCAPSULATED DIE

(75) Inventors: Paul Van Broekhoven, Needham; Richard P. Tumminelli, Ashland, both of MA (US)

(73) Assignee: The Charles Stark Draper Laboratory, Inc., Cambridge, MA (US)

( * ) Notice: Subject to any disclaimer, the term of this patent is extended or adjusted under 35 U.S.C. 154(b) by 0 days.

(21) Appl. No.: 09/663,248

(22) Filed: Sep. 15, 2000

(51) Int. Cl.$^7$ ............................................. H01L 21/66
(52) U.S. Cl. ........................ 438/15; 438/111; 438/112; 438/126; 438/127; 438/367; 438/371
(58) Field of Search ........................... 438/15, 112, 111, 438/126, 127, 367, 371

(56) References Cited

U.S. PATENT DOCUMENTS

| | | | |
|---|---|---|---|
| 3,969,813 A | 7/1976 | Minetti et al. ................. 29/575 |
| 4,043,080 A | 8/1977 | Maxwell .................... 51/33 W |
| 4,063,542 A | 12/1977 | Uemura ................ 125/30 WD |
| 4,089,704 A | 5/1978 | Heiss, Jr. et al. ............. 134/29 |
| 4,213,698 A | 7/1980 | Firtion et al. .................. 355/77 |
| 4,344,809 A | 8/1982 | Wensink ...................... 156/345 |
| 4,359,360 A | 11/1982 | Harris et al. ................. 156/345 |
| 4,384,917 A | 5/1983 | Wensink ...................... 156/627 |
| 4,822,441 A | 4/1989 | Ohta et al. ................... 156/345 |
| 4,826,556 A | 5/1989 | Kobayashi .................. 156/345 |
| 4,992,135 A | 2/1991 | Doan ........................... 156/636 |
| 5,193,314 A | 3/1993 | Wormley et al. ............. 51/165 |
| 5,223,083 A | 6/1993 | Cathey et al. ............... 156/643 |
| 5,252,179 A | 10/1993 | Ellerson et al. ............. 156/655 |
| 5,271,798 A | 12/1993 | Sandhu et al. .............. 156/638 |
| 5,291,693 A | 3/1994 | Nguyen ..................... 51/283 R |
| 5,443,675 A | 8/1995 | Wensink ...................... 156/345 |
| 5,479,108 A | 12/1995 | Cheng ......................... 324/765 |
| 5,585,675 A | * 12/1996 | Knopf .......................... 257/666 |
| 5,611,876 A | * 3/1997 | Newton et al. ................ 156/89 |
| 5,703,493 A | 12/1997 | Weeks et al. ................ 324/755 |
| 5,750,423 A | * 5/1998 | Ishii ........................... 438/112 |
| 5,766,496 A | 6/1998 | Martin ......................... 216/56 |
| 5,783,098 A | 7/1998 | Martin et al. .................. 216/56 |
| 5,792,305 A | 8/1998 | Winsemius et al. ......... 156/345 |
| 5,855,727 A | 1/1999 | Martin et al. ............... 156/345 |
| 5,915,370 A | 6/1999 | Casper .................... 125/13.01 |
| 5,932,061 A | 8/1999 | Lam ........................... 156/345 |
| 5,964,646 A | 10/1999 | Kassir et al. ................. 451/41 |
| 6,033,933 A | * 3/2000 | Hur ............................. 438/112 |
| 6,055,976 A | 5/2000 | Davies et al. ............ 125/13.01 |

OTHER PUBLICATIONS

EPI Technologies, "EPIK® EPI Technologies' Known Good Die Solution," <http://www.epitechnologies.com/epik.htm>, pp. 1–4 (*downloaded* Feb. 17, 2000).

\* cited by examiner

*Primary Examiner*—Richard Elms
*Assistant Examiner*—Pho Luu
(74) *Attorney, Agent, or Firm*—Testa, Hurwitz & Thibeault, LLP

(57) ABSTRACT

A method of decapsulating a packaged die includes removing packaging material from the bottom section of a die-containing package to expose a die pan, removing the die pan, removing material between the die pan and the bottom surface of the die, using the bottom surface of the die to determine a grind plane substantially parallel to the top surface of the die, and removing packaging material from the top section of the die-containing package to form a top surface substantially planar to the grind plane, preferably intersecting the wire bonds on the face of the die.

14 Claims, 5 Drawing Sheets

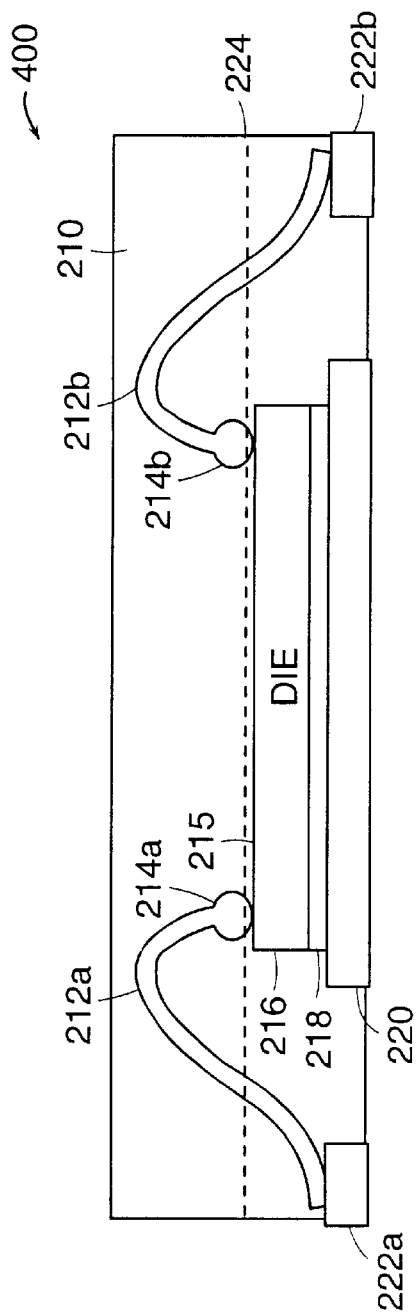
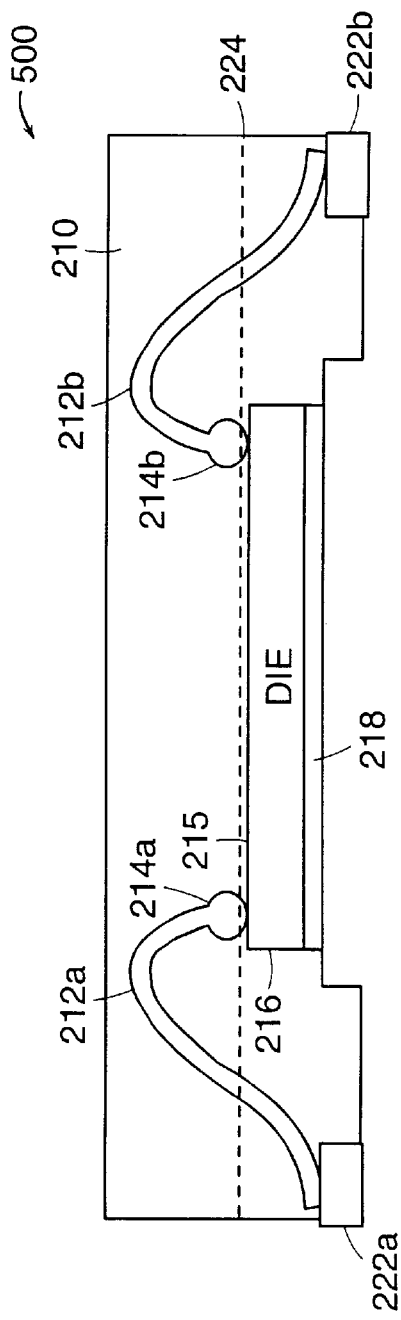

METHOD OF RECOVERING ENCAPSULATED DIE

FIELD OF THE INVENTION

The invention is generally related to methods for extracting an encapsulated device. More particularly, the invention is directed to methods for decapsulating semiconductor chips or dies.

BACKGROUND OF THE INVENTION

Packaging, particularly plastic packaging, of various electronic devices including semiconductor chips or dies has been employed for some years. It is often desirous to decapsulate the device at least in part to allow for inspection, test, and repair of the device, as well as to provide "bare die" with which to build prototype systems.

Some current methods for recovering die from encapsulated packages involve the use of commercially-available decapsulators which generally employ heated, concentrated acids such as sulfuric and nitric acids or other solvents that dissolve encapsulant material surrounding the die. Problems with these decapsulators and methods include difficulty in achieving the desired amount of etching and difficulty preventing damage to the package including the die, bonding wires, and the metallization.

There are other disadvantages to current methods relating to the state of the die after the decapsulation process. Typically, wire bonds from the original package remain and must be removed, adding a critical step in the preparation of the die, increasing overall processing time and increasing the risk of failure of the process to yield usable die. Also, the top surface, or face, of the decapsulated die may be bare and/or uneven after conventional methods are performed, making proper subsequent handling more difficult and making subsequent processing steps such as lamination of the device more difficult or impossible. There is also the problem of vulnerability of the naked "bare die" whose face is substantially exposed after processing.

Conventional methods of die preparation include use of a lapping technique to grind packages to remove encapsulant. Generally, it is critical that the bottom surface of the die be free of irregularities so that the encapsulated die remains precisely parallel to the face of the lapping tool throughout grinding, otherwise the die may become damaged or destroyed. Current lapping techniques do not provide for adequate planarization of the base of the encapsulated die for many applications.

Accordingly, the invention provides improved methods of decapsulation.

SUMMARY OF THE INVENTION

It is an object of the invention to provide a convenient method of decapsulating a packaged die. In one embodiment, the method includes removing packaging material from a bottom section of a die-containing package to expose a die pan, removing the die pan, removing material between the die pan and the bottom surface of the die, using the bottom surface of the die to determine a grind plane substantially parallel to the top surface of the die, and removing packaging material from the top section of the die-containing package to form a top surface substantially planar to the grind plane, thereby enabling, for example, subsequent inspection, testing, and repair of the die, as well as enabling use of the "bare die" in prototyping applications. In other embodiments, the method of the invention provides for decapsulating a plurality of dies concurrently.

According to one embodiment of the invention in which a single packaged die is decapsulated, a first step grinds the packaging material at the bottom of a die-containing package until a die pan is exposed, using, for example, a conventional wafer grinding machine. Another step removes the die pan. A further step etches the packaging material and/or other material, such as the die attach, from about the bottom and sides of the packaged die, creating a channel in the packaging material around the perimeter of a newly-exposed base of the die. An additional step removes material from about the sides of the die by cutting along the channel around the perimeter of the die using, for example, a wafer dicing saw. According to one feature, the exposed base of the die, with die pan and die attach removed, provides a highly planar mounting surface, which the method employs to determine a grind plane passing through a top section of the die-containing package. In one embodiment, the grind plane passes through wire bonds attached to a top surface of the die. Another step employs a conventional lapping technique to grind the top portion of the packaged die down to a level substantially parallel to the grind plane. In one embodiment, the top portion of the packaged die is ground sufficiently to expose the wire bonds on the top surface of the die.

According to a further feature, the invention preserves a passivation layer of packaging material of appropriate thickness such that it does not interfere in the operation of the die, but provides for protection of the die throughout subsequent handling and use. According to another feature, a substantially planar passivation layer provides a good surface for facilitating lamination of the die. An advantage of the inventive process is that it obviates the requirement of acid contact on the top surface of the die, thus preventing harm to components of the die, such as the die metallization, resulting from conventional decapsulation methods.

BRIEF DESCRIPTION OF DRAWINGS

The invention and its modes of operation and advantages are best understood by reference the following description of illustrative embodiments when read in conjunction with the accompanying drawings which are not necessarily to scale, and wherein:

FIG. 4 is a cross-sectional side view of the illustrative die-containing package of FIG. 3, with the die pan exposed in accord with the illustrative method of FIG. 1;

FIG. 5 is a cross-sectional side view of the illustrative die-containing package of FIG. 4, with the die pan removed in accord with the illustrative method of FIG. 1;

DESCRIPTION OF AN ILLUSTRATIVE EMBODIMENT

Figure 1:
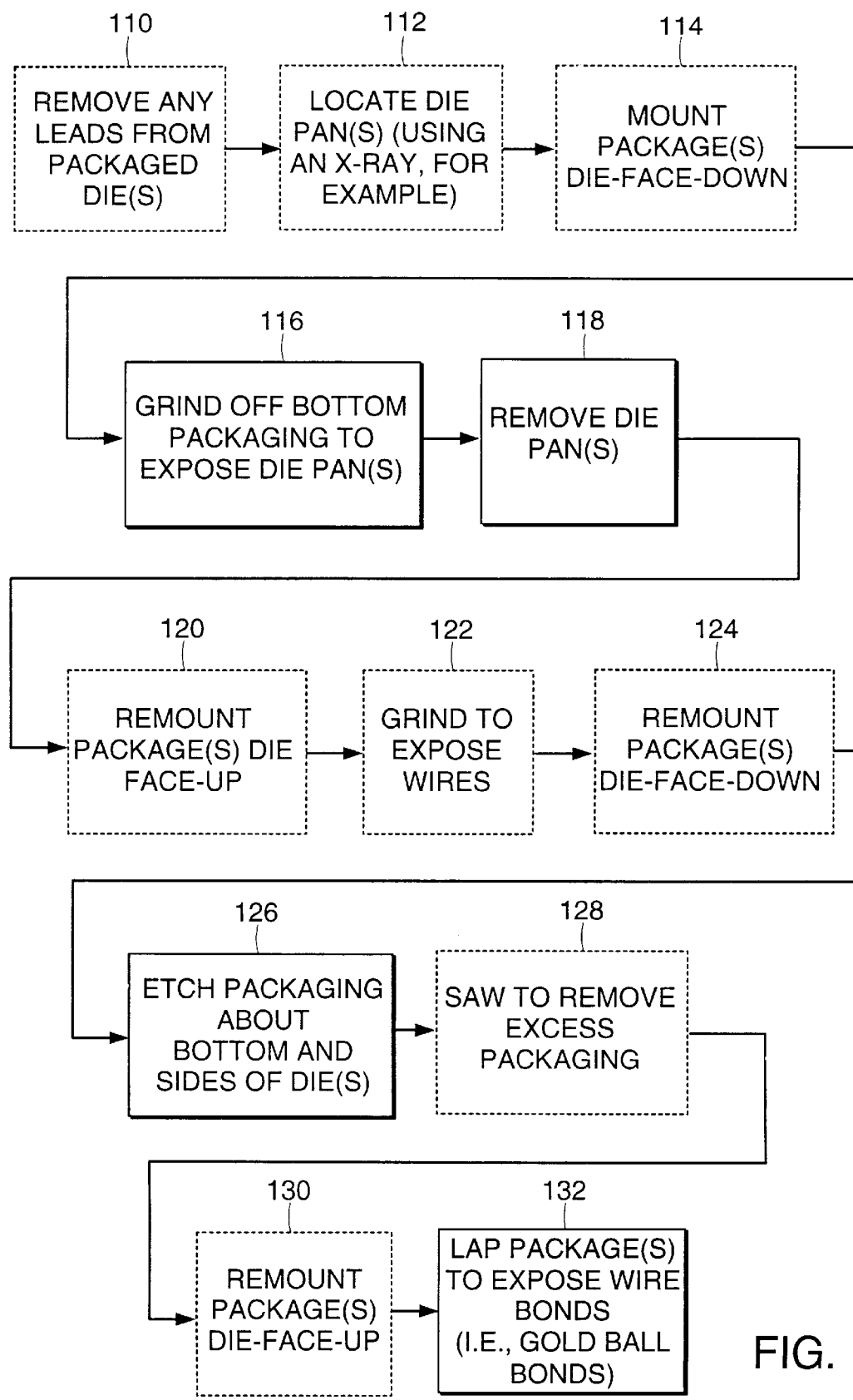
FIG. 1 is a flow diagram depicting an illustrative method according to one embodiment of the invention for decapsulating a packaged die.

FIG. 1 shows a flow diagram 100 which outlines the steps of an illustrative embodiment of the inventive method, while FIGS. 2–9 depict a cross-sectional view of a representative encapsulated die at various stages of the process outlined in FIG. 1.

Figure 2:
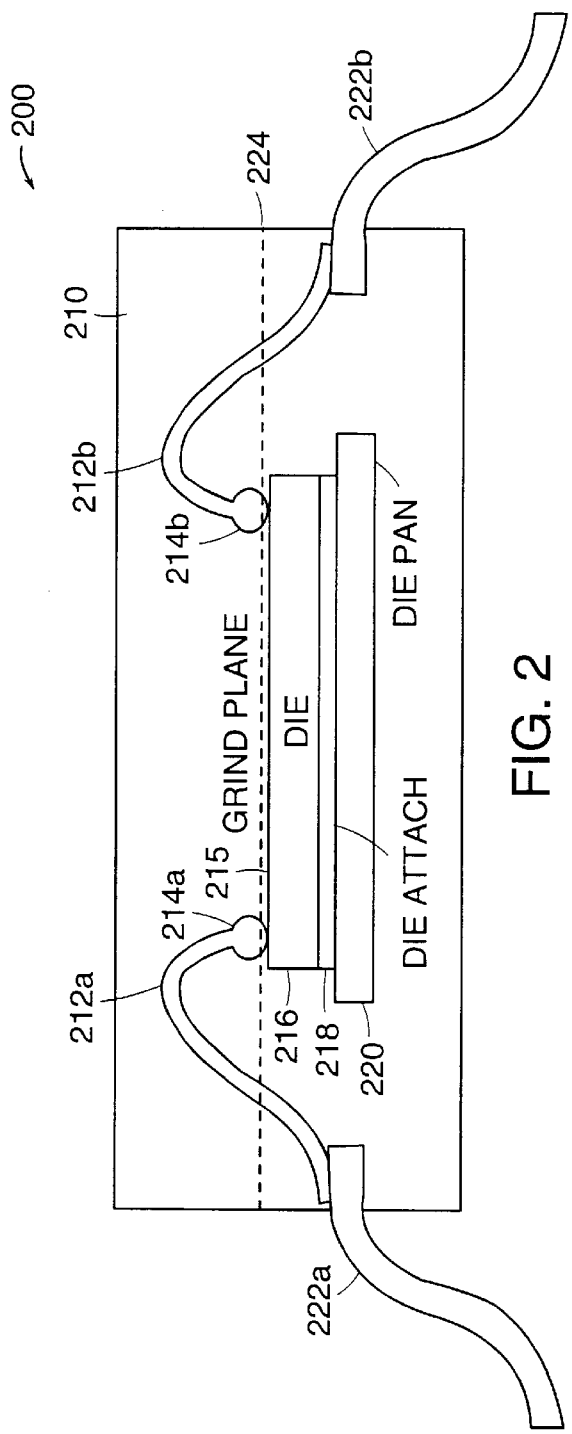
FIG. 2 is a cross-sectional side view of an illustrative die-containing package before processing according to the method of FIG. 1.

FIG. 2 depicts a die-containing package 200 in cross-sectional view prior to decapsulation processing. The die-containing package 200 comprises the packaging material 210 surrounding a die 216 which is mounted to a die pan 220 by means of a die attach 218. The wires 212a and 212b connect the external leads 222a and 222b to the top surface 215 of the die 216 by means of either gold ball bonds 214a and 214b or another type of wire bond such as aluminum wedges. The dashed line depicts the grind plane 224 which is the approximate level to which the top section (die face up) of the die-containing package 200 will be ultimately ground and/or lapped. The die pan 220 may be composed, for example, of nickel-plated copper; the die attach 218 may be composed, for example, of silver-filled conductive epoxy; and the packaging material 210 may be composed, for example, of non-conductive silica-filled epoxy.

Figure 3:
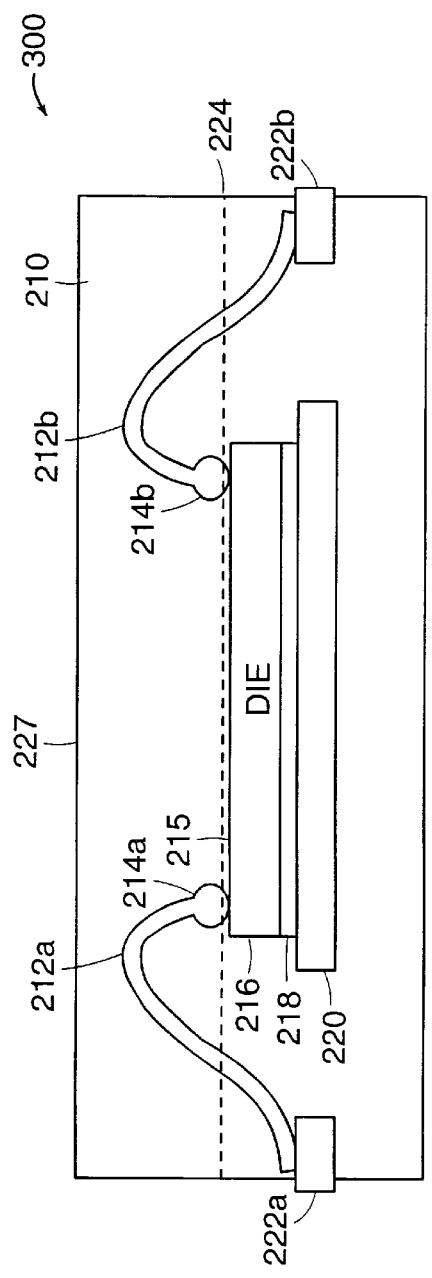
FIG. 3 is a cross-sectional side view of the illustrative die-containing package of FIG. 2, with leads clipped in accord with the illustrative method of FIG. 1.

As shown in step 110, one may begin by removing any external leads 222a and 222b from the die-containing package 200. Small diagonal cutters have been found by the inventors to work well for most types of peripheral leads. Preferably, the external leads 222a and 222b are cut off close to the package. FIG. 3 depicts a die-containing package 300 after step 110 of the process in which the external leads 222a and 222b have been removed from the die-containing package 300.

Next, as shown in step 112, one determines the location of the die pan(s) 220 embedded in the packaging material 210. A side view x-ray of the package has been found to work well for this purpose. Alternatively, the packaging material 210 at the bottom of the die-containing package(s) 300 can be hand lapped until the die pan(s) 220 is/are exposed.

Next, as shown in step 114, one bonds the top surfaces 227 of one or more packaged die(s) 300, which have undergone steps 110 and 112, to a glass lapping disk with wax. A fixture may be used to insure that the bonds are uniform and planar to the glass disk.

Next, as shown in step 116, one grinds off the packaging material 210 at the bottom of the die-containing package(s) 300 to expose the die pan(s) 220. A commercially-available, programmable wafer grinding machine, such as the "GMN model MPS2 R300" wafer grinding machine, available from G&N (Genauigkeits Maschinenbau Nurnberg GmbH), of Erlangen, Germany, may be used for this step.

FIG. 4 depicts a die-containing package 400 following step 116, at which point the die pan 220 is exposed.

Next, as shown in step 118, one removes the die pan(s) 220 from the embedded die(s) 216. For epoxy bonded die, for example, the die pan(s) 220 may be removed by using a scalpel to pry the die pan 220 off of the die 216. Alternatively, eutectic bonded dies 216 may require etching with concentrated hydrochloric acid to remove the die pan(s) 220. FIG. 5 depicts a die-containing package 500 following step 118 of the process, the removal of the die pan 220, after which the die attach 218 is exposed.

The following three steps are optional steps to reduce the time required for the final lapping step 132 discussed below.

Figure 6:
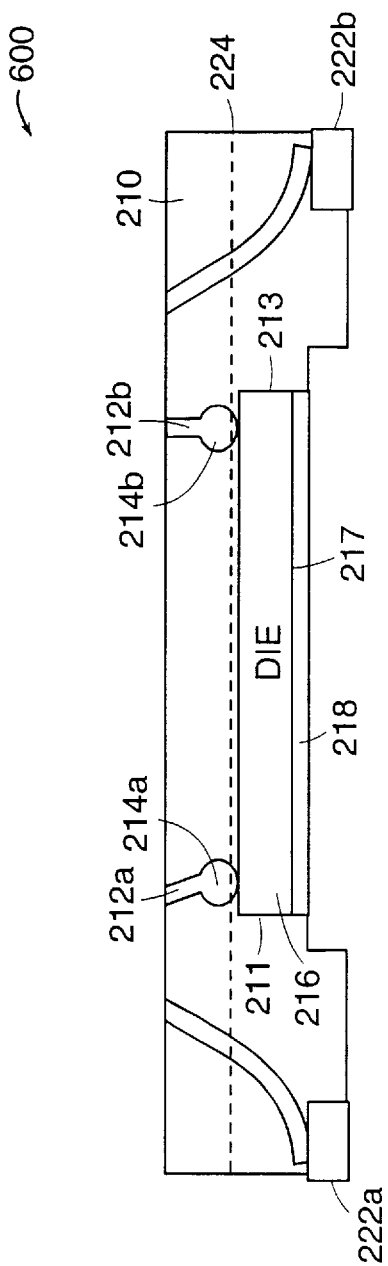
FIG. 6 is a cross-sectional side view of the illustrative die-containing package of FIG. 5, with wire bonds exposed in accord with the illustrative method of FIG. 1.

In step 120, one removes the die-containing package(s) 500 from the glass grinding disk and remounts the die-containing package(s) 500 die-face-up. In step 122, one grinds down an initial top portion of the die-containing package(s) 500 to expose the loops of the wires 212a and 212b. Again, a commercially-available, programmable wafer grinding machine may be used for this step. In step 124, one remounts the die-containing package(s) 600 die-face-down again in preparation for the etching of step 126. FIG. 6 depicts a die-containing package 600 following step 122, the grinding down of the face of the package 600, exposing the loops of the wires 212a and 212b.

Prior to step 126, the bottom(s) of the die(s) 216 remain covered with the adhesive of the die attach 218, and the side(s) of the die(s) 216 remain bonded to the packaging material 210.

Next, as shown in step 126, one employs an acid etching procedure to remove the adhesive of the die attach 218 and packaging material 210 from about the bottom surface(s) 217 and sides 211 and 213 of the die(s) 216. The etching step 126 removes insufficient packaging material 210 to enable the etchant to break through to attack the top surface(s) 215 of the die(s) 216. A commercially-available machine, such as the "D Cap-Delta Dual Acid Decapsulator," available from B&G International, of Santa Cruz, Calif., may be used for this step. Experiments were conducted using the D Cap-Delta Dual Acid Decapsulator with DIP-type packages to optimize the mix ratio of nitric acid to sulfuric acid in the etchant, as well as etch time and temperature. Experiments showed that average etch depth rapidly increases with increasing temperature, increases approximately linearly with time, and is fairly insensitive to etchant composition; however, variation in etch depth increases rapidly with decreasing ratio of nitric acid to sulfuric acid. Also, variation in etch depth was found to be minimized over a range of about 40° C. to about 60° C. and does not change significantly between about ten and about fifteen seconds of etching. Approximate optimum settings for step 126 were found from these experiments to be an acid volume ratio of about nine to one (9:1) nitric to sulfuric acid, an etch temperature of about 40° C. to about 60° C., and an etch time of about ten to about twenty seconds for the packages tested. Using an acid volume ratio of nine to one (9:1) nitric to sulfuric acid, an etch temperature of 50° C., and an etch time of 15 seconds, an etch depth of between about 130 microns and about 180 microns was achieved in these experiments.

Figure 7:
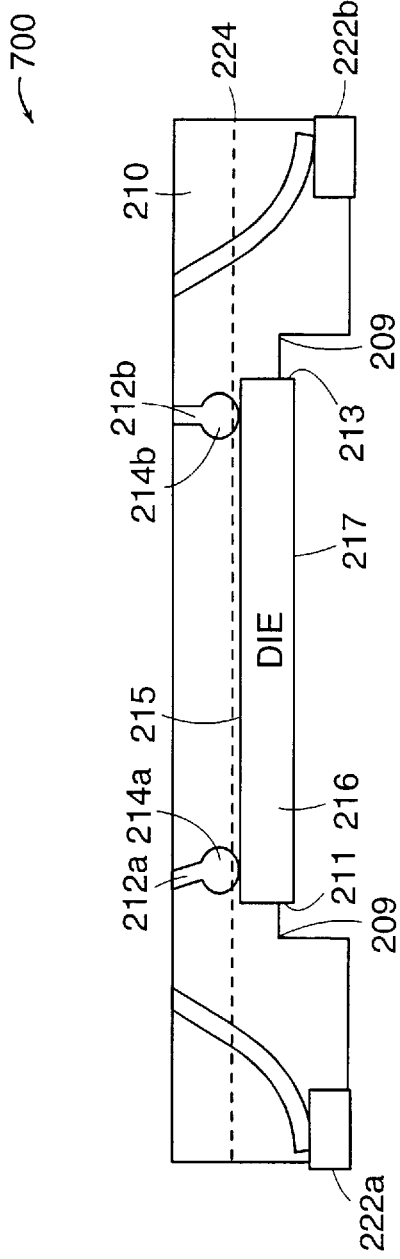
FIG. 7 is a cross-sectional side view of the illustrative die-containing package of FIG. 6, with the base and sides etched in accord with the illustrative method of FIG. 1.

FIG. 7 depicts a die-containing package 700 following step 126 of the process, the solvent etching step. In this step, one removes the die attach 218 and packaging material 210 sufficiently from about the bottom surface 217 and sides 211 and 213 of the die 216, forming a channel 209 in the packaging material 210 around the perimeter of the bottom surface 217 of the die 216 and exposing the bottom surface 217 of the die 216 itself.

Figure 8:
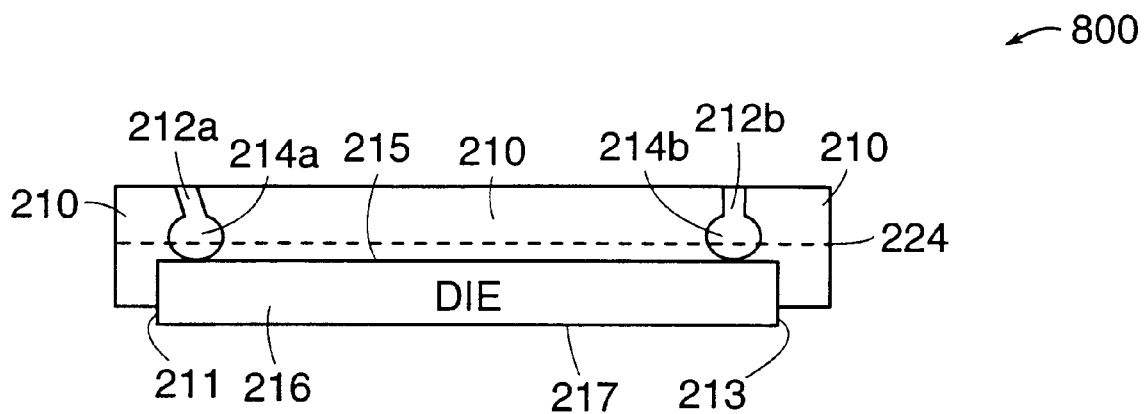
FIG. 8 is a cross-sectional side view of the illustrative die-containing package of FIG. 7 with excess packaging removed from the sides in accord with the illustrative method of FIG. 1.

Next, as shown in step 128, one removes the excess portions of the packaging material 210 around the perimeter of the die(s) 216 by cutting along the channel 209 in the packaging material 210 around the perimeter of the bottom surface(s) 217 of the die(s) 216. A commercially-available wafer dicing saw, such as the "Micro Automation Model 1006" dicing saw, available from MA Micro Automation GmbH, of Munich, Germany, may be used to perform this step. The die-containing package(s) 700 are bonded on a standard film carrier, then manually aligned and cut in the saw. FIG. 8 depicts a die-containing package 800 following step 128 of the process, the sawing away of the excess portion of the packaging material 210 around the perimeter of the die 216.

Next, as shown in step 130, one remounts the die-containing package(s) 800 die-face-up in preparation for lapping in step 132.

Assuming a prior grinding step 122, one then laps off up to approximately one hundred microns of the top section of the packaging material 210 left covering the wire bonds 214a and 214b, down to a level essentially parallel to the grind plane 224, as shown in step 132. Skilled artisans will appreciate that the amount of material lapped off in step 132 depends on the amount of material previously removed in the grinding step 122. According to the illustrative embodiment, it is important that the bottom surface(s) 217 of the die(s) 216 be substantially free of irregularities so that the bottom surface(s) can be precisely bonded parallel to the face of the lapping tool. The accuracy of this mounting determines how uniform the bond cross sections will be over the entire top surface 215 of the die 216. The bottom surface 217 of a die 216 with die pan 220 and die attach 218 removed is sufficiently planar for purposes of step 132, while the base of a die with its die pan 220 and die attach 218 intact is typically not sufficiently planar. In the case of chips with gold ball bonds 214a and 214b, the ball bonds 214a and 214b may be lapped flat to their approximate midpoint. This provides excellent bond pads for subsequent connection or testing purposes. A commercially-available lapping machine, such as the "Logitech LP50" lapping machine, available from Logitech, Ltd., of Glasgow, Scotland, may be used to perform step 132. Following step 132, the top surface(s) 219 of the die-containing package(s) 900 is/are parallel to the surface(s) 215 of the die(s) 216 to within about two microns, which makes the die(s) sufficiently planar for testing, for use in prototyping, and for other purposes.

Figure 9:
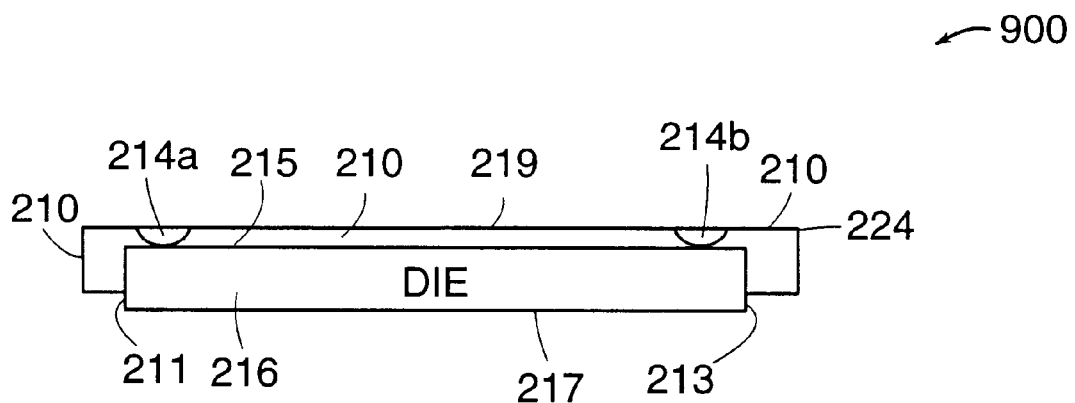
FIG. 9 is a cross-sectional side view of the illustrative die of FIG. 8 after the top face is lapped to expose the pads in accord with the illustrative method of FIG. 1.

FIG. 9 depicts a die 216 following all steps of the inventive method 100, after which the top section of the package 900 is lapped to the grind plane 224, resulting in a flat, substantially planar surface which exposes only a cross-sectional layer of the wire bonds 214a and 214b (gold ball bonds depicted), leaving the top surface 215 of the die 216 covered with a passivation layer of packaging material 210 about ten to about twelve microns thick and parallel to the actual top surface 215 of the die 216 to within about two microns.

The illustrative method described herein preserves a passivation layer of about ten to about twelve microns of encapsulate on the top surface 215 of the die 216, thus providing a flat, substantially planar surface on the top surface 215 of the die 216 preferable for lamination, and which precludes the need for removal, replacement, or addition of gold ball bonds 214a and 214b, saving delicate, labor-intensive steps. Among other advantages, the illustrative passivation layer provides protection for the top surface 215 of the die 216 for use of the die 216 in subsequent handling and operation while allowing full access to the wire bonds 214a and 214b for connection and testing purposes. The lack of acid exposure on the top surface 215 of the die 216 during decapsulation allows for a robust process that is less sensitive to etching variations, that requires less trial-and-error to determine proper etching step settings, that protects the metallization of the die, and that allows a higher decapsulation success rate, among other advantages.

One skilled in the art will appreciate that not all of the steps discussed herein are mandatory for the proper operation of the inventive method disclosed, nor must all of the steps be followed in the order they are presented for proper operation of the inventive method disclosed. For example, a process which follows the inventive method, but which leaves out steps indicated by dashed-line boxes in FIG. 1, such as steps 120, 122, and 124 (grinding down of the top packaging material 210 prior to the final lapping step 132) would be an alternative illustrative embodiment of the inventive method disclosed. Another example of an alternative illustrative embodiment of the inventive method disclosed would be a process in which steps 120, 122, and 124 are performed after, not before, step 126 or step 128.

Although the invention arose from the semiconductor industry where flat wafers of silicon are produced in encapsulated form, it should be clear that the method of the invention is not limited to the decapsulation of silicon die from packaging material. For example, the die 216 need not be composed of silicon. Thus, the foregoing description is illustrative of one embodiment of the invention, and it is to be understood that additional embodiments thereof will be obvious to skilled artisans. The embodiments described herein together with those additional embodiments are considered to be within the scope of the invention.

What is claimed is:

1. A method of decapsulation comprising,
   removing a first portion of packaging material from a bottom section of a die-containing package to expose a die pan supporting said die within said package,
   removing said die pan,
   removing interface material located between said die pan and a bottom surface of said die to expose said bottom surface of said die,
   employing said bottom surface of said die to determine a grind plane passing through a top section of said die-containing package and being substantially parallel to a top surface of said die, and
   removing packaging material from said top section of said die-containing package to form a top surface of the die-containing package substantially parallel to said grind plane.

2. A method of decapsulation according to claim 1 further comprising,
   forming said top surface at said grind plane.

3. A method of decapsulation according to claim 1 further comprising,
   removing additional packaging material from said bottom section of said die-containing package to create a channel in said packaging material around a perimeter of said bottom surface of said die.

4. A method of decapsulation according to claim 1 further comprising,
   grinding said first portion of said packaging material from said bottom section of said die-containing package to expose said die pan.

5. A method of decapsulation according to claim 1 further comprising,
   grinding said packaging material from said top section of said die-containing package to form said top surface.

6. A method of decapsulation according to claim 1 further comprising,
   lapping said packaging material from said top section of said die-containing package to form said top surface.

7. A method of decapsulation according to claim 1 further comprising,
   removing a die attach to expose s ai d bottom surface of said die.

8. A method of decapsulation according to claim 1 further comprising,
   forming said top surface to expose conductive bonds for electrically coupling to said die.

9. A method of decapsulation according to claim 1 further comprising,
    forming said top surface to retain a passivation layer of said packaging material on said top surface of said die.

10. A method of decapsulation according to claim 1 further comprising,
    etching said interface material located between said die pan and said bottom surface of said die to expose said bottom surface of said die.

11. A method of decapsulation according to claim 1 further comprising,
    etching additional packaging material from said bottom section of said die-containing package to create a channel in said packaging material around a perimeter of said bottom surface of said die.

12. A method of decapsulation comprising,
    removing a first portion of packaging material from bottom sections of a plurality of die-containing packages in a substantially concurrent manner to expose die pans supporting said dies within said packages,
    removing said die pans,
    removing interface material located between said die pans and bottom surfaces of said dies to expose said bottom surfaces of said dies,
    employing said bottom surfaces of said dies to determine a grind plane passing through top sections of said die-containing packages and being substantially parallel to top surfaces of said dies, and
    removing packaging material from said top sections of said die-containing packages to form a top surface on each of said die-containing packages, each of said top surfaces of said die-containing packages being substantially parallel to said grind plane.

13. A method of decapsulation comprising,
    removing a first portion of packaging material from bottom sections of a plurality of die-containing packages to expose die pans supporting said dies within said packages,
    removing said die pans,
    removing interface material located between said die pans and bottom surfaces of said dies in a substantially concurrent manner to expose said bottom surfaces of said dies,
    employing said bottom surfaces of said dies to determine a grind plane passing through top sections of said die-containing packages and being substantially parallel to top surfaces of said dies, and
    removing packaging material from said top sections of said die-containing packages to form a top surface on each of said die-containing packages, each of said top surfaces of said die-containing packages being substantially parallel to said grind plane.

14. A method of decapsulation comprising,
    removing a first portion of packaging material from bottom sections of a plurality of die-containing packages to expose die pans supporting said dies within said packages,
    removing said die pans,
    removing interface material located between said die pans and bottom surfaces of said dies to expose said bottom surfaces of said dies,
    employing said bottom surfaces of said dies to determine a grind plane passing through top sections of said die-containing packages and being substantially parallel to top surfaces of said dies, and
    removing packaging material from said top sections of said die-containing packages in a substantially concurrent manner to form a top surface on each of said die-containing packages, each of said top surfaces of said die-containing packages being substantially parallel to said grind plane.

* * * * *